United States Patent
Yamada

(10) Patent No.: US 11,087,828 B2
(45) Date of Patent: Aug. 10, 2021

(54) SEMICONDUCTOR STORAGE DEVICE FOR HIGH-SPEED BURST ACCESS

(71) Applicant: LAPIS Semiconductor Co., Ltd., Yokohama (JP)

(72) Inventor: Takashi Yamada, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/803,964

(22) Filed: Feb. 27, 2020

(65) Prior Publication Data

US 2020/0312401 A1  Oct. 1, 2020

(30) Foreign Application Priority Data

Mar. 29, 2019 (JP) .............................. JP2019-067433

(51) Int. Cl.
| | | |
|---|---|---|
| G11C 7/10 | (2006.01) | |
| G11C 11/4091 | (2006.01) | |
| G11C 11/4094 | (2006.01) | |
| G11C 11/408 | (2006.01) | |

(52) U.S. Cl.
CPC ........ *G11C 11/4091* (2013.01); *G11C 7/1045* (2013.01); *G11C 11/4085* (2013.01); *G11C 11/4087* (2013.01); *G11C 11/4094* (2013.01)

(58) Field of Classification Search
CPC .............. G11C 11/4091; G11C 7/1045; G11C 11/4085; G11C 11/4087; G11C 11/4094
See application file for complete search history.

(56) References Cited

U.S. PATENT DOCUMENTS

| | | | | |
|---|---|---|---|---|
| 6,337,832 B1* | 1/2002 | Ooishi | ................. | G11C 7/1045 365/219 |
| 2003/0074517 A1* | 4/2003 | Nicolai | .................... | G11C 8/04 711/5 |
| 2004/0264278 A1* | 12/2004 | Ahn | ...................... | G11C 7/1018 365/230.03 |
| 2005/0057996 A1* | 3/2005 | Yamauchi | .............. | G11C 7/103 365/222 |
| 2008/0291746 A1* | 11/2008 | Sunaga | ................ | G11C 7/1018 365/189.05 |
| 2009/0207682 A1* | 8/2009 | Ikeda | .................. | G11C 11/4076 365/230.03 |
| 2009/0235020 A1* | 9/2009 | Srinivasan | .......... | G06F 12/0607 711/106 |

FOREIGN PATENT DOCUMENTS

| | | |
|---|---|---|
| JP | 4357246 B2 | 11/2009 |
| JP | 4796390 B2 | 10/2011 |

* cited by examiner

*Primary Examiner* — Mushfique Siddique
(74) *Attorney, Agent, or Firm* — Rabin & Berdo, P.C.

(57) ABSTRACT

In writing and reading data at a semiconductor storage device, control is carried out such that, at a time of a burst mode, in a case in which a value of a block address which is, from addresses assigned to a region of an internal address, an address for selecting a sense amplifier block from plural sense amplifier blocks, is a largest value, a first sense amplifier block and a second sense amplifier block are made to access different banks, and, in case in which the value of the block address is not the largest value, the first sense amplifier block and the second sense amplifier block are made to access a same bank of plural banks.

10 Claims, 4 Drawing Sheets

SEMICONDUCTOR STORAGE DEVICE FOR HIGH-SPEED BURST ACCESS

CROSS-REFERENCE TO RELATED APPLICATION

This application claims priority under 35 USC 119 from Japanese Patent Application No. 2019-067433 filed on Mar. 29, 2019, the disclosure of which is incorporated by reference herein in its entirety.

BACKGROUND

Technical Field

The present disclosure relates to a semiconductor storage device, and in particular, to a semiconductor storage device that prevents a decrease in the operating speed that depends on the start address in burst access.

Related Art

In the reading and writing of data at a semiconductor storage device, there is a conventional method, called burst access, of accessing data of a predetermined, continuous address from a start address. Refer to Japanese Patent No. 4796390 (hereinafter called Document 1) for example. Generally, in burst access, a large amount of data is processed all at once with high parallelism at a memory array, and, in communications with the exterior of the memory array, this large amount of data is divided up finely, and is transmitted and received at a high speed with the order thereof rearranged. Due thereto, access to the memory array that requires long delay times is hidden from the exterior of the memory array, and high-speed communication is realized.

There are two types of burst access which are the wrapping mode and the non-wrapping mode. The wrapping mode is a method in which data for a limited address range (burst region) of the memory array is continued to be used repeatedly in communication to the exterior of the memory array. Namely, in the wrapping mode, "column access" is repeated only within in the burst region.

On the other hand, the non-wrapping mode is a method in which, when the "column access" is finished to the end of the burst region, processing does not return to the start of the burst region, and moves on to the start of the next burst region.

In FIG. 16(a) of Document 1, the total 64 bits of "1"~"8" are read-out all at once from the memory array, and then are outputted continuously by being divided 8 times, 8 bits each, in the order of "1"~"8". With regard to the one-time cycle of accessing the memory array which is illustrated as an example as "row access" in FIG. 16(a) of Document 1, the respective switching cycles of "1"~"8" shown by the same "RD" are exactly ⅛, and therefore, high-speed operation that is eight times faster is achieved.

This increasing of the speed of burst access has the constraint of depending on the start address. For example, in the example of FIG. 16(a) of Document 1, the start address that is the reading start address is "1", but, in FIG. 16(b) of Document 1, an example in which the start address is "7" and an example in which the start address is "8" are illustrated.

In the case of FIG. 16(b) of Document 1, if the memory array access does not start at a time that is earlier, by the latency, than the time at which "1" starts to be outputted to the exterior of the memory array, the output will not be in time, and plural memory arrays cannot be accessed simultaneously. Therefore, of the "row access" (corresponding to memory array access) in FIG. 16(b) of Document 1, the second "row access" from the left is after the first "row access" from the left, and a delay arises.

In Document 1, the driving of the column selecting line or the on operation of the bit switch that is due thereto is called a "shot". In a case in which the first column address to be accessed coincides with the last column address of the memory array, read data RD1~RD4 of four bits are pre-fetched in the initial shot, and in the next shot, read data RD5~RD8 of the four bits thereafter are pre-fetched (FIG. 7 of Document 1). Due thereto, burst access, which is on par with the case of the start address "1" shown in FIG. 7(a) of Document 1 and the case of the start address "4" shown in FIG. 7(b) of Document 1, is possible.

Further, in Japanese Patent No. 4357246 (hereinafter called Document 2), as shown in FIG. 2 of Document 2, sense amplifiers SAGA and SAGB are shared by two banks BA0 and BA1 such that the surface area is reduced, and column selecting signals can be set individually at two memory mats MATA and MATB. The general column selecting signal takes on the same value at all of the sense amplifiers that are selected simultaneously. In contrast, in addition to the internal column address, a memory mat selecting address is also input to the column decoder, and an address, which is obtained by address-incrementing the memory mat selecting address by 1, is generated within the column decoder. On the basis of the memory mat selecting address and the generated address, two column selecting signals that select different sense amplifiers are generated. Due thereto, within a limited address range in the wrapping mode, the frequency of generation of delays that accompany the constraint due to the start address of the burst access can be halved.

However, in the method of Document 1, not only is no argument made for making high-speed bursting possible in the "non-wrapping mode" even in a case in which the start address is in the vicinity of the final end such as "7" or "8", but a case in which the start address is in the vicinity of the final end is not even mentioned to begin with. Therefore, even if the frequency of generation of delays in the operating speed that accompany the constraint of the start address can be reduced, the constraint of the start address of the burst access cannot be eliminated.

Further, in the method of Document 2, in a case in which the non-wrapping mode is used and the vicinity of the final end of the simultaneous access unit is the start address, high-speed burst access cannot be realized.

SUMMARY

The present disclosure provides a semiconductor storage device that can realize high-speed burst access even in a case in which the non-wrapping mode is used and a vicinity of the final end of a simultaneous access unit is the start address.

A semiconductor storage device relating to a first aspect of the present disclosure is a semiconductor storage device that has plural banks, which include plural word lines, and plural sense amplifier blocks, which are shared between the plural banks respectively, and that, at a time of a burst mode, causes plural sense amplifier blocks respectively, which are operated simultaneously with respect to the plural banks, to access any of the plural banks, the device including a selecting section that, at the time of the burst mode, selects, from the plural sense amplifier blocks, a first sense amplifier block and a second sense amplifier block that are to be operated simultaneously, on the basis of, from addresses that is assigned to a region of an input internal address, a block address that is an address for selecting any of the sense amplifier blocks from the plural sense amplifier blocks, and a bank address that is an address for selecting any of the plural banks, a judging section that judges whether or not a value of the block address is a largest value, and a control section that carries out control so as to, in a case in which the value of the block address is the largest value, cause the first sense amplifier block and the second sense amplifier block to access different banks, and, in a case in which the value of the block address is not the largest value, cause the first sense amplifier block and the second sense amplifier block to access a same bank.

A semiconductor storage device relating to a second aspect of the present disclosure is a semiconductor storage device that has plural banks, which include plural word lines, and plural sense amplifier blocks, which are shared between the plural banks respectively, and that, at a time of a burst mode, causes plural sense amplifier blocks respectively, which are operated simultaneously with respect to the plural banks, to access any of the plural banks, the device including a selecting section that selects, from the plural sense amplifier blocks, a first sense amplifier block and a second sense amplifier block that are to be operated simultaneously, on the basis of, from addresses that is assigned to a region of an input internal address, a block address that is an address for selecting any of the sense amplifier blocks from the plural sense amplifier blocks, and a bank address that is an address for selecting any of the plural banks, and a redundant Y-block control signal that is for selecting a redundant memory array included in the plural banks respectively, a judging section that judges whether or not a value of the block address is a largest value, a control section that carries out control so as to, in a case in which the value of the block address is the largest value, cause the first sense amplifier block and the second sense amplifier block to access different banks, and, in a case in which the value of the block address is not the largest value, cause the first sense amplifier block and the second sense amplifier block to access the same bank, and a redundancy control section that, in a case in which the first sense amplifier block and the second sense amplifier block are made to access different banks of the first and second sense amplifier blocks, causes the redundant memory array to access a different sense amplifier block.

In accordance with the semiconductor storage device of the present disclosure, high-speed burst access can be realized even in a case in which the non-wrapping mode is used and the vicinity of the final end of the simultaneous access unit is the start address.

BRIEF DESCRIPTION OF THE DRAWINGS

Exemplary embodiments of the present disclosure will be described in detail based on the following figures, wherein.

DETAILED DESCRIPTION

Figure 1:
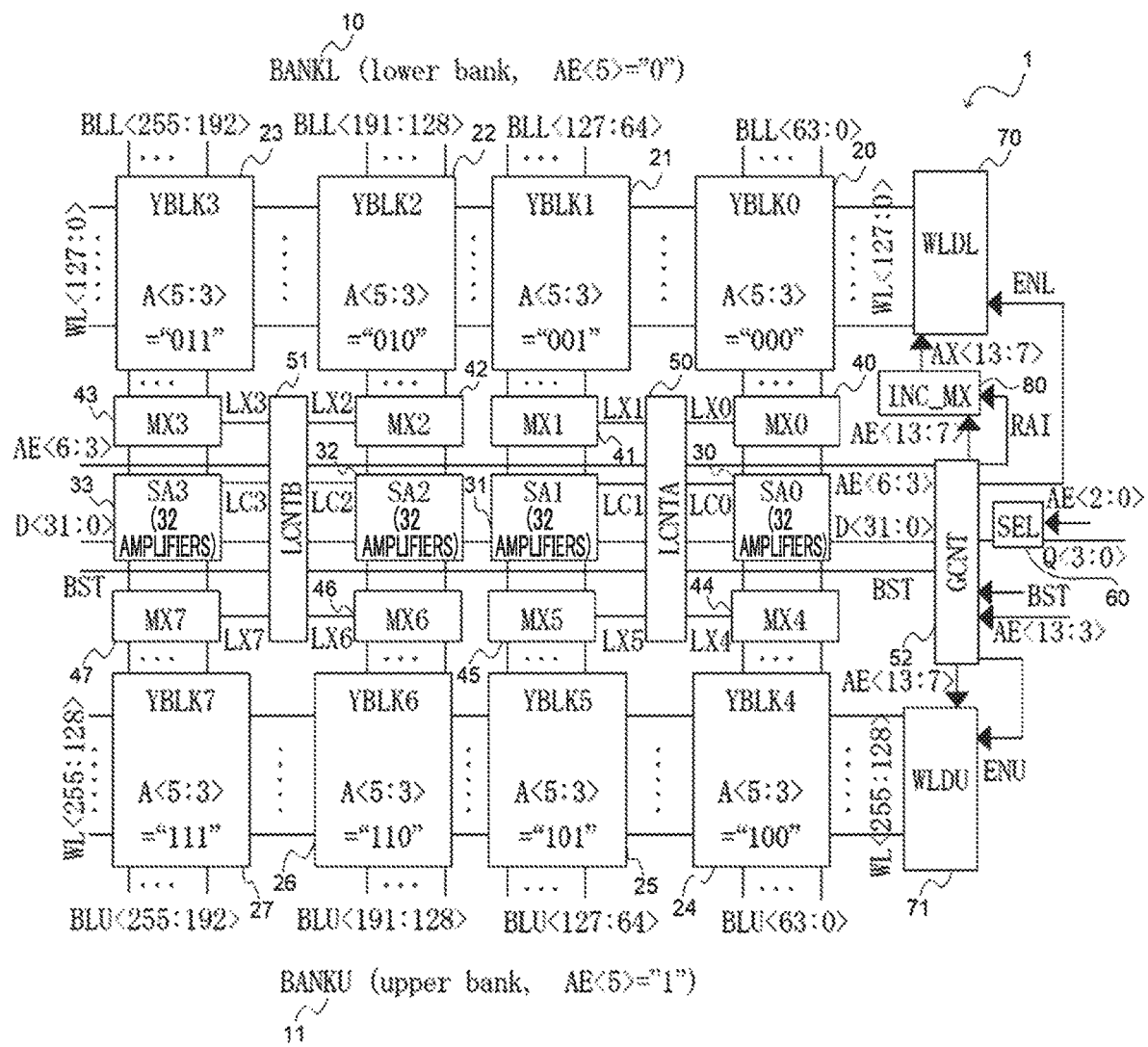
FIG. 1 is a schematic drawing showing an example of the structure of a semiconductor storage device relating to a first embodiment of the present disclosure.

Embodiments of the present disclosure are described hereinafter by using the drawings.

Semiconductor Storage Device Relating to Embodiments of Present Disclosure

Embodiments of the present disclosure are described first. The embodiments of the present disclosure relate to a semiconductor storage device (a semiconductor memory) having a burst access function, and relate to a burst operation method in which high-speed operation is possible regardless of which address the burst access is started at, and to a semiconductor storage device that can execute this method. Concretely, as the semiconductor storage device relating to the embodiments of the present disclosure, description is given of a storage device (memory) in which, in reading and writing from and to the memory array, relatively large data units are processed collectively and in parallel, and, on the other hand, communication with the exterior of the memory chip is carried out serially in smaller data units.

Regarding the Related Art

The related art that are exemplified by Documents 1 and 2 are described in detail. With regard to limits on increasing the speed of the burst access, the constraint of depending on the start address is described on the basis of paragraphs [0013]~[0020] of Document 1. Here, "1"~"8" in FIG. 16 of Document 1 is the read-out order corresponding respectively to a total of eight read data RD1~RD8 where each one is 8 bits.

For example, in FIG. 16(a) of Document 1, the total 64 bits of "1"~"8" are read-out all at once from the memory array, and then are outputted continuously by being divided 8 times into eight bits each in the order of "1"~"8". Here, the unit of access with the memory array all at once is simply called the "simultaneous access unit". In this FIG. 16(a), the 8 times of continuous accesses with the exterior of the memory array, and the 64 bits that is the number of bits thereof, are both called the "simultaneous access unit". Communication fails if the data transfer speeds to the memory array and to the exterior of the memory array do not match.

Accordingly, with regard to the one-time cycle of accessing the memory array which is illustrated as an example as "row access" in this FIG. 16(a), the respective switching cycles of "1"~"8" shown by "RD" are exactly $\frac{1}{8}$, and therefore, high-speed operation that is eight times faster is achieved. Here, this constraint is limited to a method called the "non-wrapping mode" which is one type of burst access. Namely, the "1"~"8" at the left side of "RD" in this FIG. 16(a) correspond to the total of 64 bits of data that are read-out in parallel in the hatched portion that is at the left end of the "row access" in FIG. 16(a).

On the other hand, the hatched portion in the center of the "row access" in FIG. 16(a) is access to the 64 bits of data that follow after the previous 64 bits of data. Namely, the "1"~"8" at the right side of "RD" in this FIG. 16(a) is 8-bit read data that are respectively different from the previous "1"~"8", and it is not the case that the same values are being read-out repeatedly. A group of a series of "row accesses"

such as in FIG. 16(a) corresponds to repeating "access to the next address" successively with respect to the memory array. In burst access, it is generally the case that this "next address" indicates an address that is one greater than the previous one, and therefore, the operation of incrementing the address (number) one-by-one is called "address incrementing" in particular.

A method, in which there is no address incrementing such as in the series of "row accesses" shown in FIG. 16(a), and a data group for a limited address range of the memory array is continued to be used repeatedly in communication to the exterior of the memory array, is called the "wrapping mode". The wrapping mode does not have the constraint that the data transfer speeds to the memory array and to the memory array exterior must match, and further, provided that the data group is acquired once, high speed communication can be carried out with the memory array exterior regardless of long delay times of the memory array thereafter. From the description hereto, it can be understood that, even if the delay time of the memory array access is markedly large, constraints on the speed of communication with the memory array exterior are eliminated provided that the simultaneous access unit is made larger by a corresponding amount. In the extreme, if the data of the entire memory array were all to be read and written by access of a single time, a difference in the limitations on increasing the speed in the non-wrapping mode and the wrapping mode would not exist.

However, if the simultaneous access unit is markedly large, the memory array access must be parallelized by a corresponding amount. Therefore, the surface area and the consumed electric power of the circuits needed for memory array access, such as sense amplifiers and the like, increase greatly, and this is not realistic. For example, page 13 and FIG. 3 of Document 1 are given as an example of Document 1. Here, the "pseudo" simultaneous access unit is 8, and therefore, with there originally being 8 sense amplifiers and write buffers, by carrying out time-division operation at four each, the surface area occupied by the sense amplifiers and write buffers is halved. Because the respective four sense amplifiers and write buffers are operated two times each, the total "amount" of consumed electric power is not particularly reduced as compared with operation of the 8 each all at once. However, the larger the simultaneous access unit, the greater the number of cases that the read and write operations end by being triggered by interruption from the exterior (a forced end instruction), and therefore, the greater the probability that the time-division operation, in which two times is one set, of only the first time will be executed, and the time-division operation of the second time will not be executed. In this case, the consumed amount of electric power decreases, and therefore, the average amount of electric power consumed is reduced.

In this way, even when aiming for increased speed in a burst access memory, it is strongly desired to suppress, as much as possible, parallelism (=a simultaneous access unit that is not pseudo-simultaneous) of the memory array access, and to have a circuit structure and operation that are such that the surface area and average amount of consumed electric power do not increase too much. In other words, in increasing the speed of a burst memory, the time delay accompanying the memory array access cannot be hidden unlimitedly, and there is actually limited hiding.

Therefore, for the following explanation, (1)~(3) are given as examples of types of delays that accompany memory array access, in order from that which generally has the greatest delay.

(1) Switching of the bank address and the word line block (the so-called X-block address) and the row address (=switching of the word line).
(2) Switching of the column address (=re-amplifying operation of the same sense amplifier block).
(3) Switching of the sense amplifier block (the so-called Y-block) address (=switching, at a selector, the output signals of plural sense amplifier blocks that are operated in parallel).

The "pseudo simultaneous access" in the technique disclosed in Document 1 is established provided that there is high-speed burst access of an extent that the delay of above-described (2) can be considered to be small, and is included in the "limited address range" of the wrapping mode.

However, what is called "row access" in Document 1 corresponds to above-described (1), and this delay is much larger than in above-described (2), and cannot be included in "the pseudo simultaneous access unit" by the time-division operation and "the limited address range" in the wrapping mode.

The constraint that limits on increasing the speed of burst access depend (not only on delays of memory array access, but also) on the start address of the burst access is described next.

In FIG. 16(a) of Document 1, the set of read data "1"~"8", which is acquired from the memory array in the "row access" at the left end, is outputted to the exterior of the memory array with "1" first as is. This is because, where reading is to start from is requested in advance from the exterior of the memory array, and, here, reading is to start from "1". Here, in the present specification, memory access is handled consistently, and therefore, the data number of the data at which read-out starts is simply called the "start address".

On the other hand, FIG. 16(b) of Document 1 illustrates an example in which the start address is "7" and an example in which the start address is "8". In both FIG. 16(a) and FIG. 16(b), the simultaneous access unit is 8. Therefore, the point that, in the memory accesses illustrated as the hatched portions of the "row access", "1"~"8" are read-out in parallel regardless of the start address, is the same. This can be called sacrificing flexibility of the access method (=a side effect), instead of hiding the great delays that accompany memory array access by increasing the parallelism (as seen from the memory array exterior).

In "RD" in FIG. 16(b), of the read data of "1"~"8" acquired from the memory array, data from the start address on are outputted in order to the exterior of the memory array. Note that, if, among "1"~"8", the read data that are before the start address (e.g., "1"~"6" or the like) are outputted to the exterior of the memory, faulty operation will arise, and therefore, this read data will be abandoned. The first data (=the read data corresponding to the start address), which is outputted to the exterior of the memory array as "RD" in FIG. 16(b), is outputted at the same timing as the first data of FIG. 1(a). This is because problems are brought about in the (synchronous) communication with the exterior of the memory array.

There are generally many examples in which the timing of outputting the first data (=latency) can be changed in accordance with the conditions. However, a difference in the start address within the simultaneous access unit of one time is not included among these conditions.

Focused upon next is the hatched portion "row access" that is second from the left in FIG. 16(b) of Document 1. This is for acquiring, from the memory array, the read data "1"~"8" that are at the center of "RD". If this memory array access does not start at a time that is earlier, by the latency, than the time at which "1" starts to be outputted to the exterior of the memory array, the outputting of "1" will not be in time. This "time difference" is the same as the "row access" hatched portion at the center of FIG. 16(a).

In FIG. 16(a), the initial data that are read-out to the exterior of the memory array are "1"~"8" that are a total of 8, whereas, in FIG. 16(b), there are only 2 or 1 data, and therefore, the "time" at which the outputting of "1" to the exterior of the memory array must start is much earlier in FIG. 16(b).

However, because plural memory arrays cannot be accessed simultaneously, the "row access" hatched portion that is second from the left in FIG. 16(b) (the memory array access) being made to be immediately after the "row access" of the left end is the limit, and it cannot be made to be any earlier than that.

Therefore, the output starting timing of the initial "1" in "RD" in FIG. 16(b) is delayed by 5 ns when the start address is "7", and is delayed by 20 ns when the start address is "8", and high-speed burst access fails. The nearer that the start address is to the final end (here, "8") within the simultaneous access unit, and the higher that the burst access speed is, the greater that this delay becomes.

Accordingly, it can be said that limits on making burst access high speed are strongly dependent on the start address of the burst access as well. Note that the constraint of high-speed burst access that depends on the start address appears markedly at the border between the memory array accesses of the first time and the second time, and may be ignored thereafter. The reason for this is that, as in FIG. 16 of Document 1, the read data "1"~"8", which are acquired in the "row access" from the second time thereon, are always outputted in order from "1" to the exterior of the memory array, and therefore, a memory array access delay that is equivalent to that at the time when the start address is "1" can be permitted.

Further, in the method of Document 1, high-speed burst access that is on par with the case of the start address "1" shown in FIG. 7(a) of Document 1 and the case of the start address "4" shown in FIG. 7(b) of Document 1 is possible. As mentioned previously, this is because the delay in the time-division operation of one set of four sense amplifiers can be considered to be relatively small.

However, when the time-division operation of one set of two times ends, in the "non-wrapping mode", processing must move on next to "row access", i.e., "(1) switching of the word line". Therefore, the high-speed burst access fails. By the way, in the technique of Document 1, not only is no argument made for making high-speed burst access in the "non-wrapping mode" possible even if the start address is "7" or "8", but a case in which the start address is "7" or "8" is not even mentioned in the first place.

Namely, although Document 1 states that high-speed burst access of the same extent as conventionally can be realized by half of (i.e., by four of) the sense amplifiers and write buffers, the "constraint of the high-speed burst access start address" cannot be eliminated, and the effect is limited to "a reduction in the start address constraint" at most.

The constraint of the high-speed burst access start address being reduced more by the method of Document 2 than in Document 1 is described next.

Figure 2:
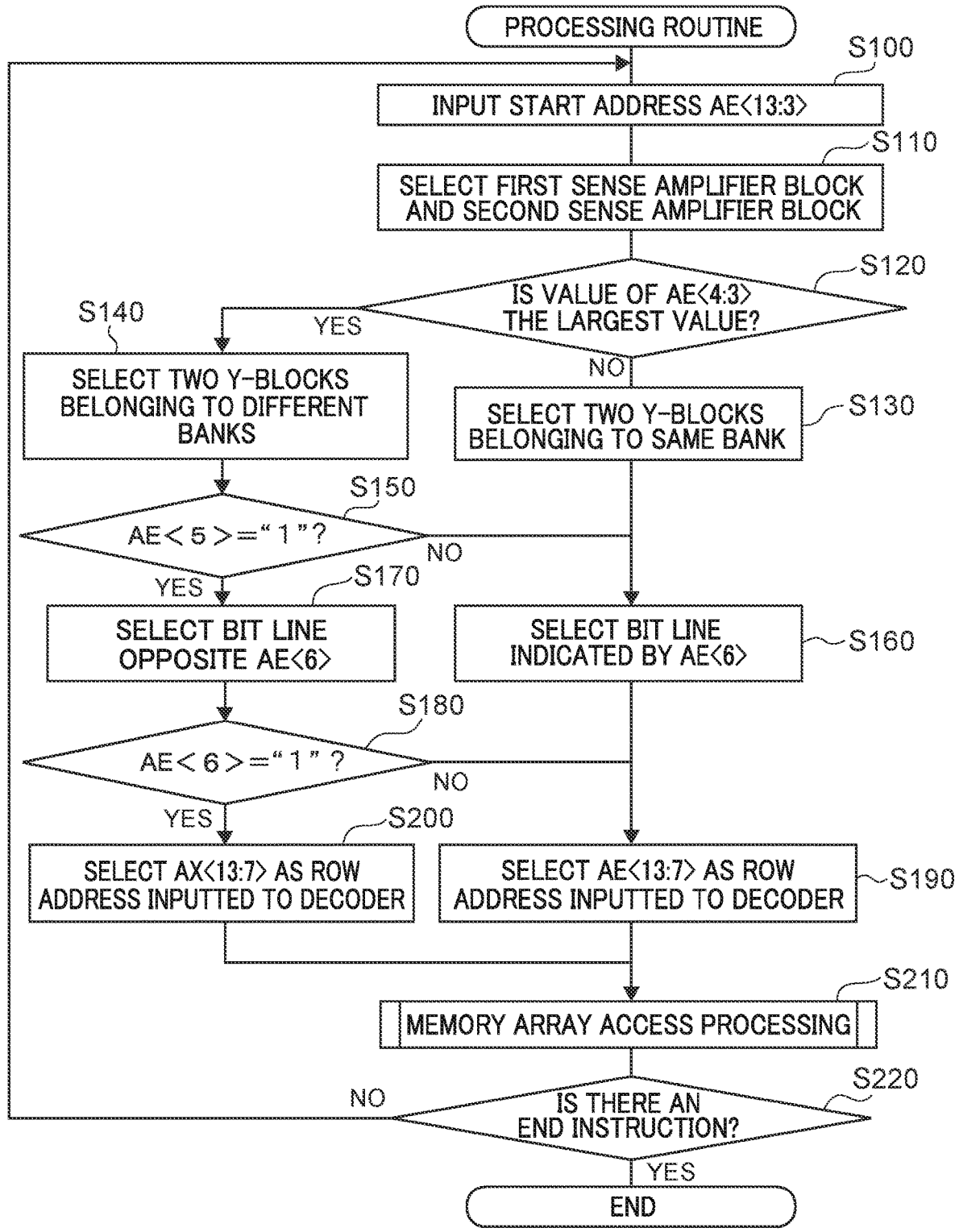
FIG. 2 is a flowchart showing a processing routine of the semiconductor storage device relating to the first embodiment of the present disclosure.

FIG. 1 and FIG. 2 of Document 2 are schematic drawings of the semiconductor storage device relating to the method of Document 2. FIG. 1 of Document 2 is an overall structural drawing of a semiconductor storage device (memory device 1) relating to the method of Document 2, and FIG. 2 of Document 2 is a circuit structure drawing of a portion thereof. Concretely, FIG. 2 of Document 2 corresponds to a structure in which elements of two banks (one X-block) are removed from memory array 2, gate control section 5, sense amplifier band 6 and SA latch circuit 7 at the right end of FIG. 1 of Document 2.

In the method of Document 2, address signal ADD<22:0> that is input from the upper left of FIG. 1 of Document 2 is assigned as follows, respectively. (This is generally called "address assignment".)

A<22>: Bank address. A 2:1 selecting signal that selects one of the banks that are included two each per one X-block that is described hereinafter.

A<21:13>: The so-called X-block address. A 512:1 selecting signal that selects one of the total of 512 blocks in the entire semiconductor storage device.

A<12:5>: Row address. A 256:1 selecting signal that selects one of the word lines included in the 256 lines per 1 bank.

A<4:3>: Column selecting signal. A 4:1 selecting signal for the column selector that is for selecting one bit line from among one set of four bit lines per one sense amplifier.

A<2:0>: The so-called page address. An 8:1 selecting signal for selecting a communication unit of 16 bits with the exterior of the memory array, from the memory array parallel access unit (=simultaneous access unit) of 128 bits.

A<2>: Memory mat selecting address. The memory mat is a unit that is specific to Document 2, and this is a 2:1 selecting signal for indicating one of the resulting divisions when the simultaneous access unit of 128 bits is divided into more significant and less significant 64 bits each. Accordingly, A<2> is also used as the aforementioned page address.

Note that differences between the bank address, the X-block address and the row address are small in the sense that the delay time that accompanies the memory array access corresponds to the above-described "(1) switching of the word line", and here, there is little need to differentiate therebetween.

The features of the method of Document 2 are, as shown in FIG. 2 of Document 2, the point that sense amplifiers SAGA and SAGB are shared between the two banks BA0 and BA1, and the surface area is reduced, and the point that the column selecting signals can be set individually at the two memory mats MATA and MATB (corresponding to CALA<3:0> and CALB<3:0>, respectively). The general column selecting signal takes-on the same value at all of the sense amplifiers that are selected simultaneously. However, in the method of Document 2, in addition to internal column address AE<4:3>, memory mat selecting address AE<2> also is input to the column decoders CDCB0 and CDCB1 shown in FIG. 2 of Document 2, and, reflecting this, column selecting signals CALA<3:0> and CALB<3:0> are respectively selected independently one-by-one. In further detail, AEinc<4:2>, which is obtained by the input memory mat selecting address AE<2> being address-incremented by 1, is generated within a column decoder band 39 of FIG. 1 of Document 2. Then, such independent selection is realized by, of the memory mat selecting address AE<2> and the address-incremented AEinc<4:2>, the memory mat selecting address AE<2>="0" being input to the column decoder CDCB0 for memory mat MATA of FIG. 2 of Document 2, and the memory mat selecting address AE<2>="1" being input to the column decoder CDCB1 for MATB.

Similarly, unselected bit line discharging control signals BRSTA<3:0> and BRSTB<3:0> also take on independent values at MATA and MATB.

Description is given next by using FIG. 13 of Document 2. This FIG. 13 illustrates the relationship between high-speed burst access start addresses (here, start addresses) and simultaneous access units corresponding respectively thereto, in the technique of Document 2.

In Document 2, there is no disclosure relating to the non-wrapping mode, and only the case of the wrapping mode is assumed. The "limited address range" in the wrapping mode corresponds to the "synchronous burst length" in FIG. 13 of Document 2. Concretely, in the case of synchronous burst length=16, the left half in FIG. 13 corresponds to the "limited address range", and, in the case of synchronous burst length=32, the entirety of FIG. 13 corresponds to the "limited address range", and one is selected by A<22:4> or A<22:5>, respectively. Respective words W0~W31 in FIG. 13 correspond to the 16-bit read data seen from the exterior of the memory array (RDE<15:0> and IOD<15:0> and DQ<15:0> in FIG. 1 of Document 2), and one is selected in accordance with the value of internal address AE<4:0>. Note that, with respect to what is called "word" here, in the same way that 8 bits are called a byte, 16 bits are simply called a word as is customary, and the word is unrelated to the word line.

Word blocks BLK #0~BLK #7 in FIG. 13 of Document 2 correspond to the memory array parallel access units per one memory mat. However, in actuality, the two memory mats MATA and MATB are always selected simultaneously. Therefore, the unit that has been called "simultaneous access unit" heretofore corresponds to two of the word blocks in FIG. 13, and corresponds to ODE<127:0> in FIG. 1 and FIG. 2 of Document 2.

The four types expressed by "simultaneous read ranges at asynchronous pages" in FIG. 13 of Document 2 indicate the "simultaneous access unit" in a case in which column selecting signal AE<4:3> cannot simultaneously be plural types, as in the case of a general semiconductor storage device. Note that "acyclic" in Document 2 is assumed to be an error of "asynchronous".

In the method of Document 2, of the AE<4:2> that correspond to the memory mats MATA and MATB, one thereof becomes a value obtained by address-incrementing the other by 1. Therefore, for example, as shown by the 'start address AE<4:2>="001"' and the 'start address AE<4:2>="101"' and the like in the lower portion of FIG. 13 of Document 2, the two continuous "4-word blocks" can be the "simultaneous access unit". In other words, for example, eight continuous words W4~W11 or W20~W27 can be the "simultaneous access unit". Here, because the wrapping mode is supposed, at the time when "synchronous burst length=16", the "4-word block BLK #0" follows after the "4-word block BLK #3", and, when "synchronous burst length=32", the "4-word block BLK #0" follows after the "4-word block BLK #7". These correspond to a 'case in which the start address is AE<4:2>="011"', and a 'case in which the start address is AE<4:2>="111"', respectively.

Looking at FIG. 1 of Document 2, in accordance with the total of three types of access forms that are asynchronous pages, synchronous burst length=16 and synchronous burst length=32, BST 32 and BST 16 signals are input to the column decoder band 39 such that the outputted column selecting signals CALA and CALB are switched.

Accordingly, in the technique disclosed in Document 2, only when processing is within the "limited address range" in the wrapping mode can the constraint of the high-speed burst access start address be greatly reduced.

A case in which "burst length=16" and the start address is word W6 is described as an example. In this example, as already mentioned in FIG. 13 of Document 2, words W0~W7 are the simultaneous access unit in a general semiconductor storage device. Therefore, the start address (=word W6) corresponds to the second from the final end, and this tends to be a constraint on the high-speed burst access.

However, in the method of Document 2, corresponding to 'start address AE<4:2>="001"' in FIG. 1 of Document 2, the simultaneous access unit shifts to words W4~W14. Therefore, the start address becomes the sixth from the final end, and can be removed from being a subject of the constraint on high-speed burst access. In the case of this example, the timing chart in a case in which the latency is 6 blocks is as in FIG. 15 of Document 2.

In this way, in the method of Document 2, the simultaneous access unit is divided into a more significant half and a less significant half, and, from there, the order of the more significant half and the less significant half can be transposed. Therefore, in the wrapping mode, the start address of the high-speed burst access can reliably be brought to the first half of the simultaneous access unit, and therefore, the degrees of freedom in the start address are high. Accordingly, the point that high degrees of freedom of the start address can be realized without raising the parallelism of the memory array access (i.e., without increasing the surface area of the sense amplifiers and the like) is superior over above-described Document 1.

Note that, in the method of Document 2, as can be understood from FIG. 13 of Document 2, the order of outputting, to the exterior of the memory array, the two 4-word blocks within the simultaneous access unit is always "the one that matches the value of the start address AE<2> is first". In the case of a general semiconductor storage device, because the 4-word block that is AE<2>="0" is first, this point as well should differ.

Accordingly, at the time of selecting the 16 bits to be outputted to the exterior of the memory array from the 128 bits of the simultaneous access unit by using selector 9 shown in FIG. 1 of Document 2, the outputting order must be switched appropriately on the basis of the total of three types of access forms that are asynchronous pages, synchronous burst length=16 and synchronous burst length=32, and the value of the start address AE<2>.

Moreover, in the method of Document 2, by using the redundant memory mat SMAT0 and the spare sense amplifier SAGC and the like that are shown at the right end of FIG. 2 of Document 2, one of the total of 512 bit lines MBL0~MBL511 that belong to the memory mat MATA or MATB can be replaced by a redundant bit line. The one bit line that is replaced is determined uniquely by output FUAD<4:2> from a fuse program section 50 at the center of FIG. 1 of Document 2, and is replaced by output data signal ODEsp at the data swap circuit 10 at the bottom of FIG. 1. Because this is a stage after the selector 9 of FIG. 1, after all, the outputting order must be switched on the basis of the above-described three types of access forms and the value of the start address AE<2>.

Regarding Operation of the Related Art

In the non-wrapping mode, there is the need to carry out address incrementing beyond the "limited address range" that is seen in the wrapping mode. For example, in FIG. 13 of Document 2, the address increment that goes beyond the word W31 at the right end that corresponds to AE<4:0>="11111" corresponds to this. When indicating the address that is one after AE<4:0>="11111", carrying-over to AE<5> occurs, and therefore, regardless of the original value of AE<22:5>, AE<22:5> changes at this time.

As can be understood from FIG. 1 of Document 2, a change in AE<22:5> means that the word line WL that is selected is switched. As described above, the delay of "(1) switching of the word line" that is a type of delay that accompanies memory array access is inevitably large. In the non-wrapping mode, regardless of the assigning of addresses, address incrementing by which the word line is switched cannot be avoided, and moreover, the address immediately therebefore becoming the start address of the burst access also cannot be avoided.

As a result, when the non-wrapping mode is applied to the method of Document 2, because there is no means for avoiding the previously-described "constraint of high-speed burst access that depends on the start address", the operating speed must be decreased more than at the time of the wrapping mode, by a corresponding amount. Accordingly, in the method of Document 2 as well, in a case in which the non-wrapping mode is used and a vicinity of the final end of the simultaneous access unit is the start address, high-speed burst access cannot be realized.

Structure of Semiconductor Storage Device Relating to First Embodiment of Present Disclosure The structure of semiconductor storage device 1 relating to the first embodiment of the present disclosure is described. The semiconductor storage device 1 relating to the present embodiment is a semiconductor storage device that has plural banks, which include plural word lines, and plural sense amplifier blocks, which that are shared by the plural banks, and that, at the time of the burst mode, causes plural sense amplifier blocks that are operated simultaneously to access plural banks including plural word lines.

The address assignation of the internal addresses at the semiconductor storage device 1 relating to the present embodiment has following constraints (i)~(iv).
(i) The bank address is 1 bit or more. Namely, this means that there are two or more banks.
(ii) The Y-block address is one bit or more. Namely, this means that there are two or more Y-blocks.
(iii) The more significant bit (A<5>) that goes beyond the most significant bit (A<4>) of the Y-block address is the least significant bit of the bank address.
(iv) The least significant bit of the address that accompanies the word line switching must be the bank address. Of course, this becomes the least significant bit of the bank address. Note that even if the entire address that accompanies switching of the word line is continuous, there is no problem if this happens occasionally, but the least significant bit of the address that accompanies switching of the word line must be the bank address (i.e., the least significant address of the bank address).

Note that, generally, it is often the case that the Y-block or the sense amplifier block indicates the sense amplifier block of the smallest simultaneous access unit, and explanation is given hereinafter by using this definition.

In the present embodiment, at the time of high-speed burst access, two of the Y-blocks are operated simultaneously. Therefore, there is essentially no problem even if the half of the simultaneous access unit at the time of high-speed burst access is expressed as the Y-block. In the case of such a definition, there is no problem in considering the memory mat that is shown in FIG. 2 of Document 2 and the Y-block to be the same.

An example of address assignation of internal addresses at the semiconductor storage device 1 relating to the first embodiment of the present disclosure is shown in order from the less significant address. In the present embodiment, description is given by using this example.
A<2:0>: Page address.
A<4:3>: Y-block address.
A<5>: Bank address.
A<6>: Column address. In the present embodiment, one bit line can be selected from one set of two bit lines.
A<13:7>: Row address. The present embodiment is structured such that one word line is selected from one set of 128 word lines.

In this example, the bank address A<5> is 1 bit and therefore satisfies constraint (i). The Y-block address A<4:3> is 2 bits and therefore satisfies constraint (ii). The more significant bit (A<5>), which goes beyond the most significant bit (A<4>) of the Y-block address A<4:3>, is the least significant bit of the bank address A<5>, and therefore satisfies constraint (iii). Further, the addresses that accompany switching of the word line are the row address A<13:7> and the bank address A<5>, and, thereamong, the least significant bit (A<5>) is the bank address A<5> and therefore satisfies constraint (iv).

The structure of the semiconductor storage device 1 relating to the first embodiment of the present disclosure is described next with reference to FIG. 1. FIG. 1 is a block drawing showing the structure of the semiconductor storage device 1 relating to the present embodiment. Note that the unit of communication with exterior of the memory array (=the read/write data width per 1 address) is 4 bits. Because the page address is 3 bits, the simultaneous access unit is 32 bits (4 bits×8).

As shown in FIG. 1, the semiconductor storage device 1 relating to the present embodiment is structured to have bank 10 (BANKL), bank 11 (BANKU), sense amplifier blocks 30~33 (SA0~SA3), column selectors 40~47 (MX0~MX7), local controller 50 (LCNTA), local controller 51 (LCNTB), global controller 52 (GCNT), selector 60 (SEL), row decoder/word driver 70 (WLDL), row decoder/word driver 71 (WLDU), and incrementing circuit 80 (INC_MX).

The bank 10 (BANKL) and the bank 11 (BANKU) are structured to have 128 word lines WL<127:0> and word lines WL<255:128>, respectively. Further, the bank 10 (BANKL) includes Y-blocks 20~23 (YBLK0~YBLK3), and the bank 11 (BANKU) includes Y-blocks 24~27 (YBLK4~YBLK7).

The sense amplifier blocks 30~33 (SA0~SA3) are structured so as to be shared by the bank 10 and the bank 11, respectively. Each of the sense amplifier blocks 30~33 (SA0~SA3) is structured to include plural sense amplifiers. In the present embodiment, each of the sense amplifier blocks 30~33 (SA0~SA3) includes 32 sense amplifiers. The sense amplifier blocks 30~33 (SA0~SA3) are disposed between the bank 10 (BANKL) and the bank 11 (BANKU), the two of which form one set, and are shared by the both, and this contributes to a reduction in the surface area.

The column selectors 40~47 (MX0~MX7) select one bit line from one set of 2 bit lines, and are connected to the sense amplifier blocks 30~33 (SA0~SA3). Further, the column selectors 40~47 (MX0~MX7) fix the bit line that is not selected at GND potential.

The local controller 50 (LCNTA) and the local controller 51 (LCNTB) respectively and individually process (decode) the input internal address AE<6:3>, and generate different column selecting signals LX0~LX7. Concretely, the local controller 50 (LCNTA) generates column selecting signals LX0, LX1, LX4 and LX5, and the local controller 51 (LCNTB) generates column selecting signals LX2, LX3, LX6 and LX7, on the basis of not only the internal address AE<6> corresponding to the column address A<6>, but also, of the internal address AE<13:3> that is used in memory cell selection, AE<5:3> which is less significant than the internal address AE<6>, and burst mode signal BST. Here, in a case in which the burst mode signal BST="1", there is the burst mode (the mode that carries out burst access), and, in a case in which the burst mode signal BST="0", there is the non-burst mode (the mode that does not carry out burst access). Further, the local controller 50 (LCNTA) and the local controller 51 (LCNTB) hand the generated column selecting signals LX0~LX7 over to the corresponding column selectors 40~47 (MX0~MX7).

Further, the local controller 50 (LCNTA) and the local controller 51 (LCNTB) generate sense amplifier control signals LC0~LC3 on the basis of not only the internal address AE<5> corresponding to the bank address A<5>, but also, of the internal address AE<13:3> that is used in memory cell selection, the internal address AE<4:3> which is less significant than the internal address AE<5>, and the burst mode signal BST.

Concretely, the local controller 50 (LCNTA) generates sense amplifier control signals LC0 and LC1, and hands the generated sense amplifier control signal LC0 over to the sense amplifier block 30 (SA0), and hands the generated sense amplifier control signal LC1 over to the sense amplifier block 31 (SA1). Further, the local controller 51 (LCNTB) generates sense amplifier control signals LC2 and LC3, and hands the generated sense amplifier control signal LC2 over to the sense amplifier block 32 (SA2), and hands the generated sense amplifier control signal LC3 over to the sense amplifier block 33 (SA3).

Here, in the present embodiment, the local controller 50 (LCNTA) and the local controller 51 (LCNTB) limit the combinations of the Y-blocks belonging to different banks that share the same sense amplifier block. Namely, the local controllers 50 (LCNTA) and 51 (LCNTB) set the limitation that, when a sense amplifier block corresponds to the smallest Y-block address within the bank thereof, that sense amplifier block must correspond to the largest Y-block address within the bank thereof. Concretely, at the time of the burst mode (BST="1"), if the value of the internal address AE<4:3>, which corresponds to the Y-block address A<4:3> is the largest value (AE<4:3>="11"), the Y-blocks are positioned at different banks, and therefore, accessing the same sense amplifier block is limited.

For example, in the case of FIG. 1, Y-block 20 (YBLK0 (corresponding to AE<5:3>="000")) and Y-block 27 (YBLK7 (corresponding to AE<5:3>="111")) must share the same sense amplifier block (any of the sense amplifier blocks 30~33 (SA0~SA3)). Similarly, Y-block 23 (YBLK3 (corresponding to AE<5:3>="011")) and Y-block 24 (YBLK4 (corresponding to AE<5:3>="100")) must share the same sense amplifier block (any of the sense amplifier blocks 30~33 (SA0~SA3)).

Further, the local controllers 50 (LCNTA) and 51 (LCNTB) are respectively shared by two adjacent Y-blocks by the two banks. This is simply because there are cases in which consolidating a circuit group that includes similar controls (here, decoding of the Y-block addresses and the bank addresses) can reduce the surface area.

Whether to activate the sense amplifier block 30 (SA0) or not is carried out on the basis of the generated sense amplifier control signal LC0. Similarly, whether to activate the sense amplifier blocks 31~33 (SA1~SA3) or not is carried out on the basis of the generated sense amplifier control signals LC1~3.

Further whether to activate the column selector 40 (MX0) (=connect any of the bit lines to the sense amplifier) or not, and, if the column selector 40 (MX0) is to be activated, which bit line is to be connected to the sense amplifier, are controlled by the generated column selecting signal LX0. The other column selectors 41~47 (MX1~MX7) as well are similarly controlled by the column selecting signals LX1~7.

The global controller 52 (GCNT) generates respective enable (activate) signals ENL and ENU of row decoders/word drivers 70 (WLDL) and 71 (WLDU), on the basis of the internal address AE<5> corresponding to the bank address, and, of the internal address AE<13:3> that is used in memory cell selection, the internal address AE<4:3> that is less significant than the bank address, and the burst mode signal BST. The global controller 52 (GCNT) hands the generated enable signal ENL over to the row decoder/word driver 70 (WLDL), and hands the generated enable signal ENU over to the row decoder/word driver 71 (WLDU).

The internal address AE<13:3> is input to the global controller 52 (GCNT) by an address incrementing circuit (not illustrated). The address incrementing circuit is a circuit for incrementing the internal address AE<13:3> that is used in memory cell selection. Each time that memory array access of one time ends, in the burst mode (BST="1"), the address incrementing circuit increments AE<13:3> by 2 each time, and, in the non-burst mode (BST="0"), the address incrementing circuit increments AE<13:3> by 1 each time. The AE<13:3> input itself at the right end of FIG. 1 corresponds to the output of this address incrementing circuit.

Further, the global controller 52 (GCNT) generates a 2-to-1 selecting signal RAI on the basis of, of the internal address AE<13:3> for memory cell selection, the internal address AE<6:3> that is less significant than the internal address AE<13:7> corresponding to the row address, and the burst mode signal BST. The global controller 52 (GCNT) hands the generated 2-to-1 selecting signal RAI over to the incrementing circuit 80.

Further, the global controller 52 (GCNT) is a structure having a latch circuit built therein. Note that the latch circuit may be a structure that is incorporated in the selector 60 (SEL).

The selector 60 (SEL) selects outside-memory-array data bus Q<3:0> from in-memory-array data bus D<31:0>, on the basis of the internal address AE<2:0> corresponding to the page address.

On the basis of row address AX<13:7> that is outputted by the incrementing circuit 80 (INC_MX), and the enable signal ENL, the row decoder/word driver 70 (WLDL) selects one word line from the 128 word lines WL<127:0>, and activates that word line. The row address AX<13:7> outputted by the incrementing circuit 80 (INC_MX) is either internal address AE<13:7> itself that corresponds to the row address, or a value obtained by incrementing the internal address AE<13:7> by 1.

On the basis of the internal address AE<13:7> corresponding to the row address and the enable signal ENU, the row decoder/word driver 71 (WLDU) selects one word line from among the 128 word lines WL<128:255>, and activates that word line.

The incrementing circuit 80 (INC_MX) is a circuit with a 2-to-1 selector, and generates row address AX<13:7> on the basis of the internal address AE<13:7> corresponding to the row address, and the two-to-one selecting signal RAI. The incrementing circuit 80 (INC_MX) hands the generated row address AX<13:7> over to the row decoder/word driver 70 (WLDL).

Here, in order to further increase the speed, as shown in FIG. 2 of Document 2, individual data busses may be provided respectively at two sense amplifier blocks that are selected simultaneously, and the transfer operation may be carried out in parallel. Namely, adapting this to the semiconductor storage device 1 relating to the present embodiment, two 32-bit data busses are readied (for a total of 64 bits), and one is exclusively used for the even-numbered sense amplifier blocks, and the other is exclusively used for the odd-numbered sense amplifier blocks. Further, it suffices to structure the device such that the sense amplifier blocks 30 (SA0) and 32 (SA2) are connected to the data bus used exclusively for the even-numbered sense amplifier blocks, and the sense amplifier blocks 31 (SA1) and 33 (SA3) are connected to the data bus exclusively used for the odd-numbered sense amplifier blocks.

Operation of Semiconductor Storage Device
Relating to First Embodiment of Present Disclosure Operation of the semiconductor storage device 1 relating to the first embodiment of the present disclosure is described next. Table 1 is a table showing the relationships of correspondence between the Y-blocks, the row decoder/word drivers and the sense amplifier blocks that are simultaneously selected (=activated) at the time of the burst mode (BST="1") in the semiconductor storage device 1 relating to the present embodiment, and the internal address AE<5:3> that is the start address.

TABLE 1

| AE<5:3> | selected Y-block | | selected row decoder | access of first half | access of second half |
|---|---|---|---|---|---|
| "000" | YBLK0 | YBLK1 | WLDL | SA0 | SA1 |
| "001" | YBLK1 | YBLK2 | | SA1 | SA2 |
| "010" | YBLK2 | YBLK3 | | SA2 | SA3 |
| "011" | YBLK3 | YBLK4 | WLDL & WLDU | SA3 | SA0 |
| "100" | YBLK4 | YBLK5 | WLDU | SA0 | SA1 |
| "101" | YBLK5 | YBLK6 | | SA1 | SA2 |
| "110" | YBLK6 | YBLK7 | | SA2 | SA3 |
| "111" | YBLK7 | YBLK0 | WLDL & WLDU | SA3 | SA0 |

Here, the access of first half/access of second half at the right end of Table 1 illustrate the data bus access order at the time when the data bus D<31:0> is shared by the two sense amplifier blocks that are selected simultaneously and is time-division operated. Note that, although not shown in Table 1, when the Y-blocks 20~27 (YBLK0~YBLK7) are respectively selected, the column selector MX0~MX7 adjacent thereto is always selected together therewith.

The semiconductor storage device 1 relating to the present embodiment aims to always simultaneously operate the "simultaneous access unit" (for one Y-block) corresponding to the start address at the time of the burst mode, and the "simultaneous access unit" corresponding to the address obtained by address-incrementing the start address one time.

As can be understood from Table 1, it is often the case that a total of two Y-blocks, which are the Y-block corresponding to the input address AE<5:3> and the Y-block disposed adjacent thereto at the left side thereof in FIG. 1, are selected simultaneously. However, when AE<4:3>="11", because the Y-block at the left end is selected, exceptionally, the Y-block at the right end that "belongs to the bank opposite that indicated by the bank address A<5>" is selected together therewith. As shown in Table 1, to handle such an exception, not only the two sense amplifier blocks 30 and 33 (SA0 and SA3) and column selectors 40 and 47 (MX0 and MX7) or column selectors 43 and 44 (MX3 and MX4), but also the two row decoders/word drivers 70 (WLDL) and 71 (WLDU) are selected simultaneously, and one word line WL is selected at each. Note that, at the time when one word line WL is selected at each of the two banks, the electric power used in operation is greater than at usual times. However, as shown in Table 1, the probability of this condition (AE<4:3>="11") is low, and therefore, the average electric power is kept low.

The conditions for this handling of the exception to occur are that the Y-block address is the largest value (in FIG. 1, A<4:3>="11") and that it is the time of the burst mode (BST="1"). It is clear that the subjects reflecting such handling of the exception are only the column selecting signal LX0, the column selecting signal LX4, the sense amplifier control signal LC0, the enable signal ENL and the enable signal ENU. Therefore, these controls can be realized by using a general logic circuit (combinational circuit).

Table 2 is a table that shows the relationships of correspondence of the start address AE<6:3> with the column selectors that are simultaneously selected (activated) at the time of the burst mode in the semiconductor storage device 1, and which bit line, of the one set of two bit lines, the selected column selector connects to the sense amplifier block.

TABLE 2

| AE<6> | AE<5:3> | selected column selector | bit line selected by selector listed at left |
|---|---|---|---|
| "0" | other than "111" | (other than MX7) (other than MX0) | bit line corresponding to AE<6> = "0" |
| "0" | "111" | MX7 | |
| | | MX0 | bit line corresponding to AE<6> = "1" |
| "1" | other than "111" | (other than MX7) (other than MX0) | bit line corresponding to AE<6> = "1" |
| "1" | "111" | MX7 | |
| | | MX0 | bit line corresponding to AE<6> = "0" |

As shown in Table 2, because A<6> is assigned to the column address, in almost all cases, the bit line indicated by AE<6> of the start address is of course selected. However, in the semiconductor storage device 1, only when AE<5:3>="111", the column selector MX0 exceptionally connects the bit line, which is opposite that indicated by A<6>, to the sense amplifier block 30 (SA0).

The exceptional processing shown in Table 2 is realized by, within the local controller 50 (LCNTA), judging whether or not BST="1" and AE<5:3>="111", and reflecting the results of this judgement in the column selecting signal LX0.

Table 3 is a table showing the relationships of correspondence between the start address AE<13:3>, and the row decoder/word driver, which is selected (=activated) at the time of the burst mode in the semiconductor storage device 1, and the (internal) row address that is input to the selected row decoder/word driver.

TABLE 3

| AE<6:5> | AE<4:3> | selected row decoder | row address input to decoder listed at left |
|---|---|---|---|
| "00" | other than "11" | WLDL | AE<13:7> |
|  | "11" | WLDL |  |
|  |  | WLDU |  |
| "01" | other than "11" | WLDU |  |
|  | "11" | WLDU |  |
|  |  | WLDL |  |
| "10" | other than "11" | WLDL |  |
|  | "11" | WLDL |  |
|  |  | WLDU |  |
| "11" | other than "11" | WLDU |  |
|  | "11" | WLDU |  |
|  |  | WLDL | AX<13:7> after incrementing one time |

As shown in Table 3, because A<13:7> is assigned to the row address, in almost all cases, the start address AE<13:7> is input as is to the row decoder/word driver by the global controller 52 (GCNT). However, in the semiconductor storage device 1 relating to the first embodiment of the present disclosure, exceptionally, only when AE<6:3>="1111", the (internal) row address that is input to the row decoder/word driver 70 (WLDL) is replaced by the value (AX<13:7>) obtained by incrementing AE<13:7> one time by the incrementing circuit 80 (INC_MX) (the lower end of Table 3).

The exceptional processing shown in the lower end of Table 3 is realized by judging, within the global controller 52 (GCNT) of the semiconductor storage device 1, whether or not BST="1" and AE<6:3>="1111", and reflecting the results of judgement in the 2-to-1 selecting signal RAI to the incrementing circuit 80 (INC_MX). Namely, the input row address AX<13:7> to the row decoder/word driver 70 (WLDL) shown in FIG. 1 is the same as AE<13:7> if RAI="0", and is the value obtained by incrementing AE<13:7> one time if RAI="1". For example, if AE<13:7>="1111111" and RAI="1", AX<13:7>="0000000", and the word line WL<0> of bank 10 (BANKL) and WL<255> of bank 11 (BANKU) are raised (=selected) simultaneously.

Note that, in the above explanation, each time memory array access of one time ends, the address incrementing circuit (not illustrated) increments the internal address AE<13:3> that is input from the right end of FIG. 1. At this time, in the burst mode (BST="1"), AE<13:3> is incremented by two each time. For example, in a case in which, in the initial array access, Y-block 21 (YBLK1) and Y-block 22 (YBLK2) are selected simultaneously (i.e., the initial address AE<6:3>="0001"), and even if this array access ends, the burst access still continues, next time, it is desirable to simultaneously select Y-block 23 (YBLK3) and Y-block 24 (YBLK4), and therefore, it suffices to start the array access again after incrementing by two addresses.

Further, if the non-burst mode is used (BST="0"), the Y-blocks are selected one-by-one, and therefore, the address incrementing circuit carries out address incrementing one-by-one.

The flow of the overall processing at the semiconductor storage device 1 relating to the present embodiment is described next by using FIG. 2. FIG. 2 is a flowchart showing a processing routine relating to the first embodiment of the present disclosure. Note that description is given of a case at the time of the burst mode (BST="1") in this processing.

In step S100, the global controller 52 (GCNT) receives input of internal address AE<13:3> that is the start address.

In step S110, the local controller 50 (LCNTA) or the local controller 51 (LCNTB) selects a first sense amplifier block and a second sense amplifier block, which are to be operated simultaneously, from the plural sense amplifier blocks 30~33 (SA0~SA3) on the basis of, of the addresses assigned to the internal address AE<13:3> that was received in above-described step S100, the internal address AE<5> that corresponds to the bank address A<5> from the plural sense amplifier blocks 30~33 (SA0~SA3), and, of the internal address AE<13:3> used in memory cell selection, the internal address AE<4:3> that is less significant than the internal address AE<5>.

In step S120, the local controller 50 (LCNTA) or the local controller 51 (LCNTB) judges whether or not the value of block address AE<4:3> is the largest value.

If the value of block address <4:3> is not the largest value (NO in above-described step S120), in step S130, on the basis of bank address AE<5>, two Y-blocks that belong to the same bank are selected, and the routine moves on to step S160.

On the other hand, if the value of block address AE<4:3> is the largest value (YES in above-described step S120), in step S140, on the basis of bank address AE<5>, two Y-blocks belonging to different banks are selected, and the routine moves on to step S150.

In step S150, it is judged whether or not bank address AE<5>="1". If bank address AE<5> is not "1" (NO in above-described step S150), in step S160, the bit line indicated by internal address AE<6> is selected, and the routine moves on to step S190.

On the other hand, if bank address AE<5> is 1 (YES in above-described step S150), in step S170, the bit line, which is opposite the bit line indicated by internal address AE<6>, is selected, and the routine move on to step S180.

In step S180, it is judged whether or not internal address AE<6>="1". If internal address AE<6> is not "1" (NO in above-described step S180), in step S190, AE<13:7> is selected as the row address to be input to the row decoder/word driver 70 (WLDL).

On the other hand, if internal address AE<6> is "1" (YES in above-described step S180), in step S200, AX<13:7> is selected as the row address to be input to the row decoder/word driver 70 (WLDL).

In step S210, the row decoder/word driver 70 (WLDL) or the row decoder/word driver 71 (WLDU) selects a word line for the same bank or for each of the respectively different banks that are to be accessed by the first sense amplifier block and the second sense amplifier block, on the basis of row address AE<13:7>, which is, of the addresses assigned to the internal address AE<13:3>, the address for selecting a word line from plural word lines. Burst access is carried out with respect to the memory array.

In step S220, it is judged whether or not there is an end instruction. If there is no end instruction (NO in above-described step S220), the routine returns to step S100, and the processings of steps S100~S210 are repeated. On the other hand, if there is an end instruction (YES in above-described step S220), processing is ended.

As described above, in accordance with the semiconductor storage device relating to the first embodiment of the present disclosure, at the time of the burst access mode, in a case in which the value of the block address which is, of the addresses assigned to the internal address, the address for selecting the sense amplifier block from the among the plural sense amplifier blocks, is the largest value, the first sense amplifier block and the second sense amplifier block are made to access different banks, and, in a case in which the value of the block address is not the largest value, the first sense amplifier block and the second sense amplifier block are made to access the same bank. Due thereto, even in a case in which the non-wrapping mode is being used and the vicinity of the final end of the simultaneous access unit is the start address, high-speed burst access can be realized.

Operation of the first embodiment is described in detail hereinafter. As described above, the "constraint of the high-speed burst mode start address" has been described by using the left end ("7" and "8") of RD of FIG. 16(b) of Document 1 and the right end ("W31" and the like) of the table of FIG. 13 of Document 2. However, essentially, the reason that this constraint arises is that, when the final end of (in the wrapping mode, what is called) the "limited address range" is passed beyond and address incrementing is carried out (in the non-wrapping mode), it comes out of the "simultaneous access unit". In particular, in correspondence with above-described "(1) switching of the word line" at this time, it is often the case that the delay time that accompanies memory access becomes large, and therefore, high-speed burst access fails.

However, the semiconductor storage device 1 relating to the present embodiment has a memory array structure that has plural Y-blocks and banks. Memory addresses are assigned such that the more significant bit, which goes beyond the most significant bit of a Y-block address, becomes the least significant bit of the bank address, and, moreover, all of the addresses that contribute to word line switching are assigned to more significance than the least significant bit of that bank address.

In accordance with such a structure, at the time of expanding the parallel access unit (=the simultaneous access unit) of the memory array by selecting Y-blocks two at a time in the high-speed burst access, it can be made such that the start address always belongs to further toward the first half than the center of the simultaneous access unit that has been expanded. Therefore, (in the same way as the method shown in FIG. 13 of Document 2), the "constraint of the high-speed burst mode start address" can be avoided. Namely, by sensing, in advance, the largest value of the less significant address, the increment can always be read in advance, and therefore, avoiding of the constraint of the high-speed burst mode start address can be realized.

Further, in the semiconductor storage device 1 relating to the present embodiment, when the final end of the Y-block address is passed beyond and the address is incremented, the selected bank is switched, and then the Y-block address returns to the start. Therefore, burst access can be continued without the array access being made to fail by the raising of two word lines within a single bank, and without the delay greatly increasing by switching the word lines during the array access, and without further increasing the number of sense amplifiers.

Similarly, in address incrementing when the final end of the bank address is passed beyond, the row address and the like that have been allocated to higher significance than the bank address are incremented, and the word line and the like are switched, and then the bank address is returned to the start. Therefore, as a result, the large delay in the memory array access, which accompanies switching of the word lines over the entire address range of the semiconductor memory, can be hidden, and high-speed burst access in the non-burst mode which does not have the constraint of the start address can be realized by a realistic number of sense amplifiers.

Overview of Semiconductor Storage Device Relating to Second Embodiment of Present Disclosure An overview of a semiconductor storage device 2 relating to the second embodiment of the present disclosure is described next. Generally, each individual semiconductor memory that is mass-produced includes partial manufacturing defects, and it is often the case that such partial defects are replaced by spare (=redundant) circuit parts that have been readied in advance, and can be repaired before being shipped-out. There are many forms of readying such redundant parts. For example, in FIG. 2 of Document 2, any one of the total of 512 bit lines per one bank can be replaced by the redundant bit line that is at the right end of FIG. 2 of Document 2.

Further, there are many types of means for recording which bit line has been replaced. For example, in FIG. 1 of Document 2, the fuse program section 50 corresponds to such a means.

The second embodiment of the present disclosure has a redundant structure in which any one of the four usual Y-blocks per one bank is entirely replaced by a redundant Y-block. In this structure, the surface area of what are called the fuse program unit and the fuse determining unit and the like in FIG. 1 of Document 1 can be made to be smaller.

Figure 3:
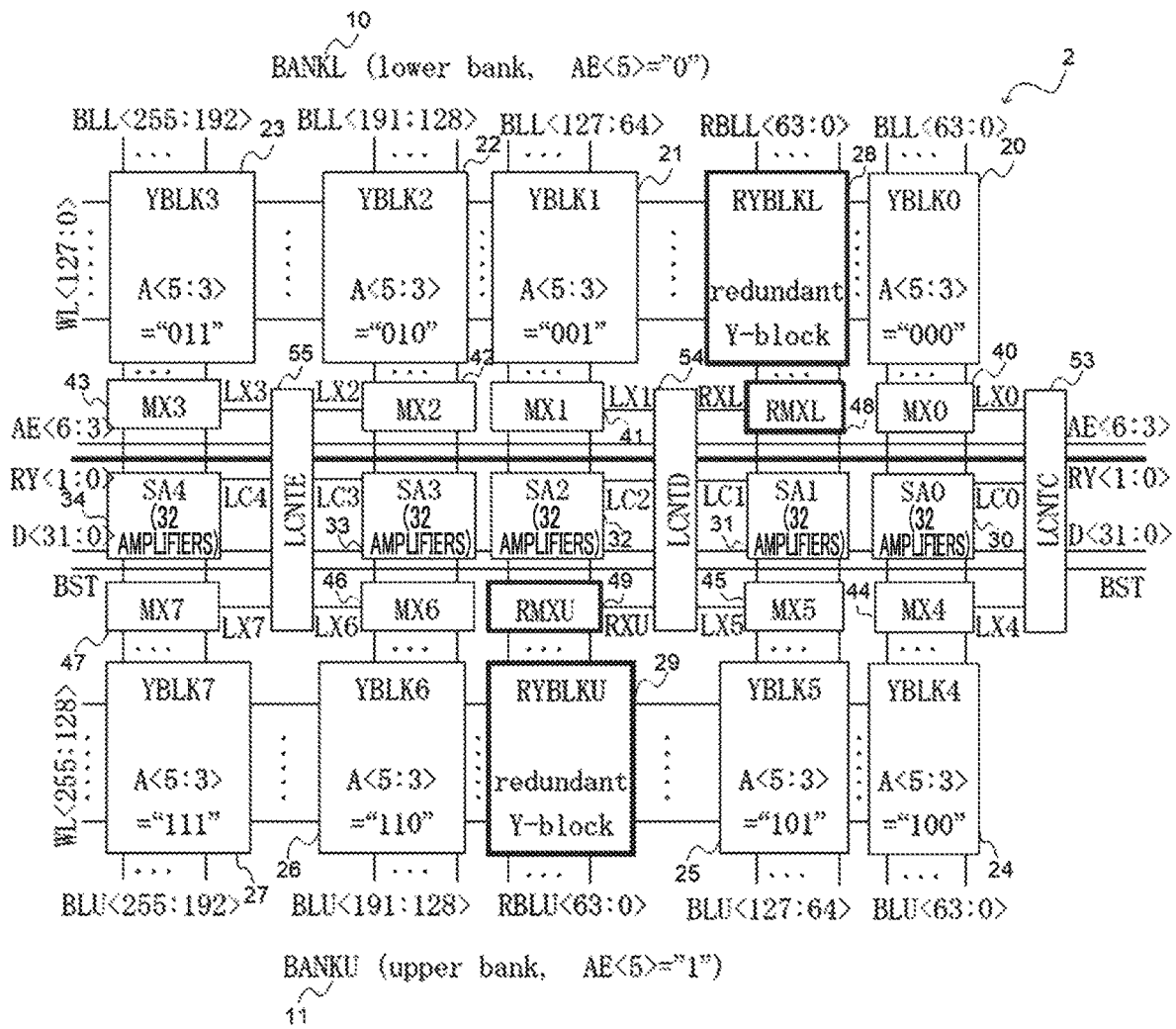
FIG. 3 is a schematic drawing showing an example of the structure of a semiconductor storage device relating to a second embodiment of the present disclosure.

Structure of Semiconductor Storage Device Relating to Second Embodiment of Present Disclosure The structure of the semiconductor storage device 2 relating to the second embodiment of the present disclosure is described by using FIG. 3. Note that structures that are similar to those of the semiconductor storage device 1 relating to the first embodiment are denoted by the same reference numerals, and detailed description thereof is omitted.

A unique feature of the semiconductor storage device 2 is the arrangement order of where, within the banks, the redundant Y-blocks are to be inserted. In further detail, there is a feature in the point that, for one set of 2 Y-blocks (belonging to respective different banks) that share a same sense amplifier, there are items that are prohibited for the usual Y-blocks that are combined with redundant Y-blocks.

These two restricted items are as follows.
(i) The two redundant Y-blocks must share the same sense amplifier block.
(ii) The usual Y-block that is combined with the redundant Y-block must be a block that corresponds to the smallest or the largest Y-block address within the bank.

FIG. 3 is a block drawing showing the structure of the semiconductor storage device 2 relating to the present embodiment. As compared with the semiconductor storage device 1 relating to the first embodiment, the semiconductor storage device 2 relating to the present embodiment additionally has a redundant Y-block 28 (RYBLKL) and a redundant Y-block 29 (RYBLKU), and there are 5 Y-blocks for each one bank.

As shown in FIG. 3, the semiconductor storage device 2 is structured to have the bank 10 (BANKL), the bank 11 (BANKU), sense amplifier blocks 30~34 (SA0~SA4), the column selectors 40~47 (MX0~MX7), redundant column selector 48 (RMXL), redundant column selector 49 (RMXU), local controller 53 (LCNTC), local controller 54 (LCNTD), local controller 55 (LCNTE), the global controller 52 (GCNT), the selector 60 (SEL), the row decoder/word driver 70 (WLDL), the row decoder/word driver 71 (WLDU), and the incrementing circuit 80 (INC_MX).

Note that the global controller 52 (GCNT), the row decoder/word driver 70 (WLDL), the row decoder/word driver 71 (WLDU), the selector 60 (SEL) and the incrementing circuit 80 (INC_MX) are omitted from FIG. 3. Further, the semiconductor memory device 2 similarly includes circuit elements relating to the redundancy function in FIG. 1 of Document 2 (e.g., the fuse program unit 50, the fuse determining unit 26, the signal generating unit 25, the redundancy control unit 50 #). However, because these elements are general elements in a semiconductor memory that has a redundancy function, they are omitted from FIG. 3.

The bank 10 (BANKL) includes the Y-blocks 20~23 (YBLK0~3) and the redundant Y-block 28 (RYBLKL). Further, the bank 11 (BANKU) includes the Y-blocks 24~27 (YBLK4~7) and the redundant Y-block 29 (RYBLKU).

In the semiconductor storage device 2 relating to the second embodiment, in the Y-blocks that belong to the bank 10 (BANKL) and the bank 11 (BANKU) respectively, Y-block 20 (YBLK0), Y-block 23 (YBLK3), Y-block 24 (YBLK4) and Y-block 27 (YBLK7), which correspond to the smallest or the largest block address, all must share the same sense amplifier block as redundant Y-block 28 (RYBLKL) and redundant Y-block 29 (RYBLKU).

Further, as a point that differs from the first embodiment, the sense amplifier block 34 (SA4), the column selectors 48 (RMXL) and 49 (RMXU), and the local controllers 53~55 (LCNTC~LCNTE) which accompany the increase in the number of Y-blocks per one bank, and redundant bit lines RBLL<63:0> and RBLU<63:0>, are added. However, these are not features that are unique to the present disclosure.

The local controllers 53~55 (LCNTC~LCNTE) differ from the local controllers 51 (LCNTA) and 52 (LCNTB) of FIG. 1 with regard to fine points, such as the column selectors and the sense amplifier blocks that are the objects of control thereof are different, and the like. However, the point that the local controllers 53~55 (LCNTC~LCNTE) can be realized by general logic circuits (combinatorial circuits) is the same as with the local controllers 51 (LCNTA) and 52 (LCNTB), and therefore, details are omitted.

Redundant Y-block control signal RY<1:0> of FIG. 3 (transferred on the bold line in FIG. 3) has following features (I) and (II).
(I) The redundant Y-block control signal RY<1:0> is not merely used in order to activate the redundant Y-block, but also is used in order to deactivate the usual Y-block that is replaced accompanying this. In FIG. 3, RY<1:0> is input not only to the local controller 54 (LCNTD) that controls the redundant Y-block, but also to the local controllers 53 (LCNTC) and 55 (LCNTE) as well. This is in order to make it possible to forcibly de-select the usual Y-block indicated by the internal address AE<5:3>.
(II) As shown by the first half access and the second half access of Table 1 of the first embodiment and the like, in the semiconductor storage device 2 as well, similarly, it is clearly decided, of the memory array access data of the two Y-blocks that are selected simultaneously, which is to be used first and which is to be used thereafter in communications with the memory array exterior. In correspondence therewith, the redundant Y-block control signal RY<1:0> must be able to express at least the following three information (II-1)~(II-3).

(II-1) Replacement with a redundant Y-block is not carried out.
(II-2) Of the two Y-blocks that are selected simultaneously, the Y-block that corresponds to the first half access (in Table 1) is replaced with a redundant Y-block.
(II-3) Similarly, the Y-block of the second half access is replaced with a redundant Y-block.

Note that, in FIG. 3, the redundant Y-block control signal RY is a 2-bit signal, but is, of course not limited to this, and may be a signal of an even larger number of bits.

Features (a)~(d) of the second embodiment, which are different than the features of the previously-described first embodiment, are exemplified next.
(a) The 2-to-1 selecting signal RAI to the incrementing circuit INC_MX that has a 2-to-1 selector is generated not only on the basis of AE<6:3> that is less significant than the row address and the burst mode signal BST, but also on the basis of the redundant Y-block control signal RY<1:0>.
(b) The respective activating signals ENL and ENU of the row decoder/word drivers 70 (WLDL) and 71 (WLDU) are generated not only on the basis of, of the internal address AE<13:3> that is used in memory cell selection, the internal address AE<5> corresponding to the bank address, and AE<4:3> that is less significant than the internal address AE<5>, and the burst mode signal BST, but, in addition thereto, also on the basis of the redundant Y-block control signal RY<1:0>.
(c) Whether or not to activate the column selectors 40~47 (MX0~MX7) and the redundant column selectors 48 (RMXL) and 49 (RXMU), and whether or not to activate the sense amplifier blocks 30~34 (SA0~SA4), are controlled not only on the basis of, of the internal address AE<13:3> that is used in memory cell selection, the internal address AE<5> corresponding to the bank address, and AE<4:3> that is less significant than the internal address AE<5>, and the burst mode signal BST, but, in addition thereto, also on the basis of the redundant Y-block control signal RY<1:0>.
(d) In a case in which the column selector 40 (MX0) and the redundant column selector 48 (RMXL) that belongs to the less significant bank are activated, which bit line is to be connected to the sense amplifier is controlled not only on the basis of, of the internal address AE<13:3> that is used in memory cell selection, the internal address AE<6> corresponding to the column address, and the internal address AE<5:3> that is less significant than the internal address AE<6>, and the burst mode signal BST, but, in addition thereto, also on the basis of the redundant Y-block control signal RY<1:0>.

Note that the first embodiment describes a structure in which the two selected sense amplifier blocks are parallel-operated (instead of time-division operated). However, in the second embodiment, at the time of applying this parallel operation, the method of connecting the two sets of 32-bit data busses and the sense amplifiers is different. Namely, the sense amplifier blocks 31 (SA1) and 32 (SA2) that are connected to the redundant Y-block 28 (RYBLKL) and the redundant Y-block 29 (RYBLKU) must be able to be connected to both of the two sets of 32-bit data busses. This is because the redundant Y-blocks 28 (RYBLKL) and 29 (RYBLKU) can carry out both replacement of the even-numbered usual Y-blocks and replacement of the odd-numbered ones.

Operation of Semiconductor Storage Device Relating to Second Embodiment of Present Disclosure Operation of the semiconductor storage device 2 relating to the second embodiment of the present disclosure is described next. Note that description of operations that are similar to those of the semiconductor storage device 1 relating to the first embodiment is omitted.

Table 4 is a table that is a version of Table 1 that has been changed in accordance with the semiconductor storage device 2 relating to the present embodiment. Concretely, Table 4 differs from Table 1 with respect to the points that the selected sense amplifier blocks (the first half access and the second half access at the right of Table 4) are added, and cases in which there is replacement and cases in which there is no replacement by the redundant Y-blocks 28 (RYBLKL) and 29 (RYBLKU) are added.

TABLE 4

| AE<5:3> | selected Y-block | | selected row decoder | first half access | second half access |
|---|---|---|---|---|---|
| "000" | YBLK0 | YBLK1 | WLDL | SA0 | SA2 |
| | RYBLKL | YBLK1 | | SA1 | SA2 |
| | YBLK0 | RYBLKL | | SA0 | SA1 |
| "001" | YBLK1 | YBLK2 | | SA2 | SA3 |
| | RYBLKL | YBLK2 | | SA1 | SA3 |
| | YBLK1 | RYBLKL | | SA2 | SA1 |
| "010" | YBLK2 | YBLK3 | | SA3 | SA4 |
| | RYBLKL | YBLK3 | | SA1 | SA4 |
| | YBLK2 | RYBLKL | | SA3 | SA1 |
| "011" | YBLK3 | YBLK4 | WLDL& | SA4 | SA0 |
| | RYBLKL | YBLK4 | WLDU | SA1 | SA0 |
| | YBLK3 | RYBLKU | | SA4 | SA2 |
| | RYBLKL | RYBLKU | | SA1 | SA2 |
| "100" | YBLK4 | YBLK5 | WLDU | SA0 | SA1 |
| | RYBLKU | YBLK5 | | SA2 | SA1 |
| | YBLK4 | RYBLKU | | SA0 | SA2 |
| "101" | YBLK5 | YBLK6 | | SA1 | SA3 |
| | RYBLKU | YBLK6 | | SA2 | SA3 |
| | YBLK5 | RYBLKU | | SA1 | SA2 |
| "110" | YBLK6 | YBLK7 | | SA3 | SA4 |
| | RYBLKU | YBLK7 | | SA2 | SA4 |
| | YBLK6 | RYBLKU | | SA3 | SA2 |
| "111" | YBLK7 | YBLK0 | WLDL& | SA4 | SA0 |
| | RYBLKU | YBKL0 | WLDU | SA2 | SA0 |
| | YBLK7 | RYBLKL | | SA4 | SA1 |
| | RYBLKU | RYBLKL | | SA2 | SA1 |

As can be understood from Table 4, even in a case in which there is replacement with a redundant Y-block, the relatively small number of sense amplifier blocks SA0~SA4 are combined appropriately, and simultaneous selection of two Y-blocks at the time of the burst mode (BST="1") can be realized. In other words, at the time of simultaneously selecting two Y-blocks, the failure of both being connected to one sense amplifier block does not occur. Accordingly, in the semiconductor storage device 2 relating to the present embodiment that also uses redundant Y-blocks, the "constraint of the start address at the time of high-speed burst access" can be avoided, in the same way as in the semiconductor storage device 1 relating to the first embodiment.

Table 5 is a table that is a version of Table 2 that has been changed in accordance with the semiconductor storage device 2 relating to the present embodiment at the time of the burst mode. Table 5 differs from Table 2 with respect to the point that the selected column selector is rewritten, and the above-described points including cases in which there is replacement with the redundant Y-blocks RYBLKL/RYBLKU.

TABLE 5

| AE<6> | AE<5:3> | selected column selector | bit line selected by selector listed at left |
|---|---|---|---|
| "0" | other than "111" | (other than MX7) (other than MX0) | bit line corresponding to AE<6> = "0" |
| "0" | "111" | MX7 or RMXU | |
| | | MX0 or RMXL | bit line corresponding to AE<6> = "1" |
| "1" | other than "111" | (other than MX7) (other than MX0) | bit line corresponding to AE<6> = "1" |
| "1" | "111" | MX7 or RMXU | |
| | | MX0 or RMXL | bit line corresponding to AE<6> = "0" |

As can be understood from Table 5, the operation of making the bit line, which is selected at the column selector when the internal address AE<5:3>="111", be opposite the bit line indicated by internal address AE<6> (i.e., the replacing operation) can occur not only at the column selector 40 (MX0), but also at the redundant column selector 48 (RMXL). Namely, at both of the local controllers 53 (LCNTC) and 54 (LCNTD), the special handling (processing) of an exception in such a case in which the internal address AE<5:3>="111" must be able to be executed. Further, which of the local controllers 53 (LCNTC) and 54 (LCNTD) is to be selected can be realized on the basis of the redundant Y-block control signal RY<1:0>.

Figure 4:
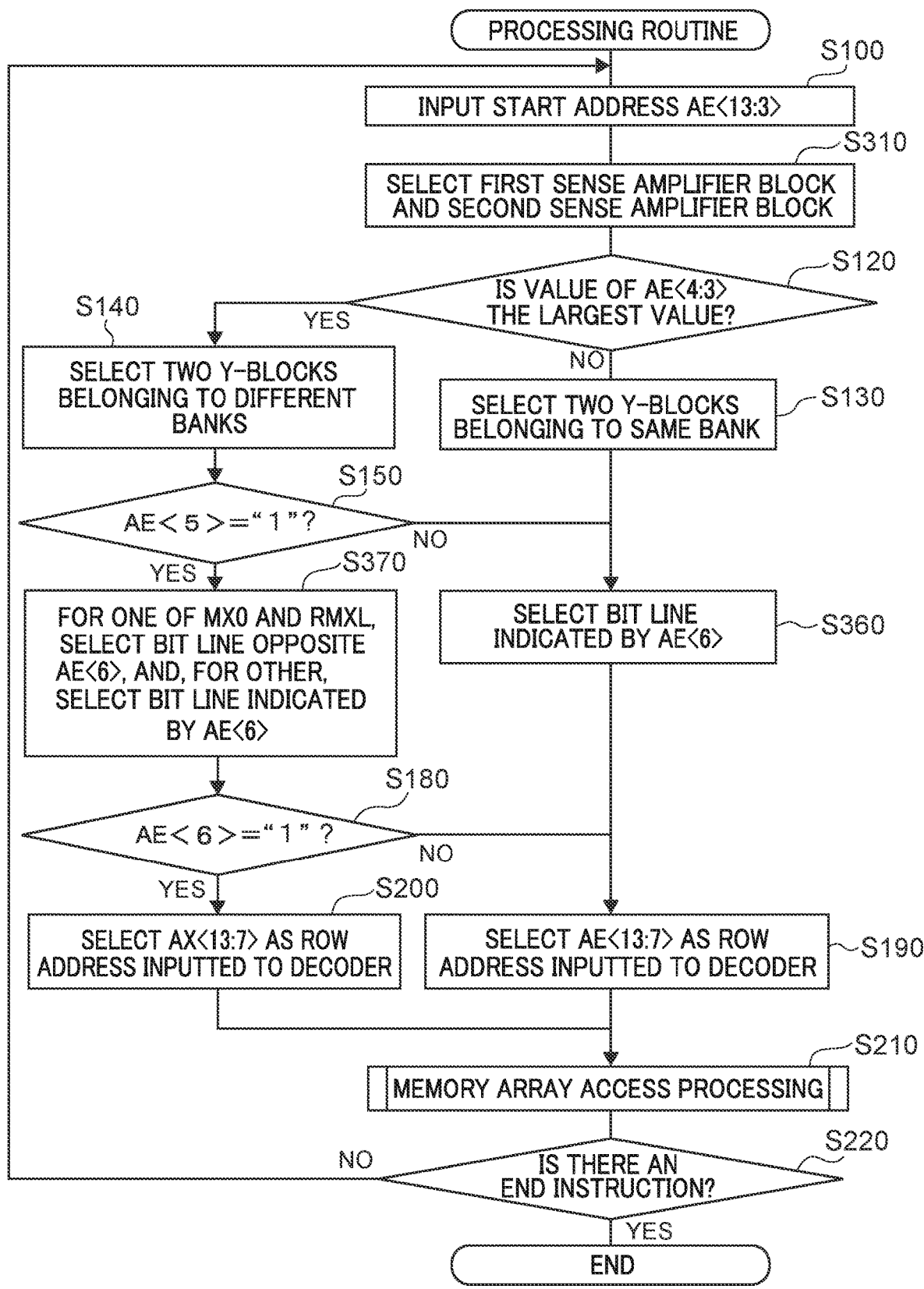
FIG. 4 is a flowchart showing a processing routine of the semiconductor storage device relating to the second embodiment of the present disclosure.

The flow of the overall processing at the semiconductor storage device 2 relating to the present embodiment is described next by using FIG. 4. FIG. 4 is a flowchart showing a processing routine relating to the embodiment of the present disclosure. Note that processing that is similar to those of the processing routine relating to the first embodiment are denoted by the same reference numerals as in FIG. 2, and detailed description thereof is omitted. Note that, in the second embodiment as well, in the same way as in the first embodiment, description is given of a case at the time of the burst mode (BST="1") in this processing.

In step S100, the global controller 52 (GCNT) receives input of internal address AE<13:3> that is the start address.

In step S310, the local controller 53 (LCNTC), the local controller 54 (LCNTD) or the local controller 55 (LCNTE) selects a first sense amplifier block and a second sense amplifier block, which are to be operated simultaneously, from the plural sense amplifier blocks 30~34 (SA0~SA4) and on the basis of, of the addresses assigned to internal address AE<13:3> that was received in above-described step S100, the internal address AE<5> that corresponds to the bank address A<5> from the plural sense amplifier blocks 30~34 (SA0~SA4), and, of the internal address AE<13:3> used in memory cell selection, the internal address AE<4:3> that is less significant than the internal address AE<5>, and the redundant Y-block control signal RY<1:0>.

In step S370, the bit line, which is opposite the bit line indicated by the internal address AE<6>, is selected for one of the column selector 40 (MX0) and the redundant column selector 48 (RMXL), and the bit line indicated by the internal address AE<6> is selected for the other, and the routine moves on to step S180.

As described above, in accordance with the semiconductor storage device relating to the second embodiment of the present disclosure, in a case in which a first sense amplifier block and a second sense amplifier block are made to access different banks on the basis of the value of the block address which is, of the addresses assigned to the internal address, the address for selecting the sense amplifier block from the plural sense amplifier blocks, the first and second sense amplifier blocks are made to access the redundant memory arrays that are included in these two banks respectively. Due thereto, high-speed burst access can be realized even in a case in which a redundant memory array is included, and the non-wrapping mode is used, and a vicinity of the final end of the simultaneous access unit is the start address.

Namely, by devising the arranged order (the located places) of where, within the banks, the redundant Y-blocks are to be inserted, at the time of simultaneously selecting two Y-blocks at the time of the burst mode, the failure of the two Y-blocks simultaneously being connected to one sense amplifier block can be avoided. As a result, in accordance with the semiconductor storage device 2 relating to the second embodiment of the present disclosure as well, in the same way as in the semiconductor storage device 1 relating to the first embodiment, the "constraint of the start address at the time of high-speed burst access" can be avoided.

Note that the present disclosure is not limited to the above-described embodiments, and various modifications and applications are possible within a scope that does not depart from the gist of the present disclosure.

For example, the above-described embodiments describe semiconductor memories that have 2 banks and 4 or 5 Y-blocks, and at which the column selector carries out 2:1 bit line selection. However, the present disclosure is not limited to this.

Further, the second embodiment describes a semiconductor memory with a redundancy function that has redundant Y-blocks. However, even if there is another redundancy method such as shown in FIG. 1 of Document 2 and FIG. 2 of Document 2, such a method can be combined with an embodiment of the present disclosure. In this case, it suffices to use the arrangement order of the Y-blocks such as shown in FIG. 1, and a form of redundancy information at which there is no differentiation between first half access and second half access.

What is claimed is:

1. A semiconductor storage device that has a plurality of banks, which include a plurality of word lines, and a plurality of sense amplifier blocks, which are shared between the plurality of banks respectively, and that, at a time of a burst mode, causes the plurality of sense amplifier blocks respectively, which are operated simultaneously with respect to the plurality of banks, to access any of the plurality of banks, the device comprising:
a selecting section that, at the time of the burst mode, selects, from the plurality of sense amplifier blocks, a first sense amplifier block and a second sense amplifier block that are to be operated simultaneously, on the basis of, from addresses that are assigned to a region of an input internal address, a block address that is an address for selecting any of the sense amplifier blocks from the plurality of sense amplifier blocks, and a bank address that is an address for selecting any of the plurality of banks;
a judging section that judges whether or not a value of the block address is a largest value; and
a control section that carries out control so as to, in a case in which the value of the block address is the largest value, cause the first sense amplifier block to access one bank of the plurality of banks and the second sense amplifier block to access another bank of the plurality of banks, and, in a case in which the value of the block address is not the largest value, cause the first sense amplifier block and the second sense amplifier block to access the one bank.

2. The semiconductor storage device of claim 1, further comprising:
a word line selecting section that selects a word line for a same bank or for each of respectively different banks that are accessed by the first sense amplifier block and the second sense amplifier block, on the basis of, from addresses assigned to a region of the internal address, a row address that includes the bank address and is an address for selecting any word line from the plurality of word lines,
wherein a least significant bit of a bank address, which is, from addresses assigned to a region of the internal address, an address for selecting any of the plurality of banks, is assigned to a region of the internal address so as to become a bit that is one more significant than a most significant bit of the block address, and
a least significant bit of the row address is the least significant bit of the bank address.

3. The semiconductor storage device of claim 2, further comprising:
a bit line selecting section that, in a case in which a value of the block address is a largest value, judges whether or not the bank address is a largest value, and, in a case in which the bank address is not the largest value, selects a bit line indicated by a column address that is, from addresses assigned to a region of the internal address, an address for selecting a column, and, in a case in which the bank address is the largest value, selects a bit line that is different from the bit line indicated by the column address,
wherein a least significant bit of the column address is assigned to a region of the internal address so as to become a bit that is one more significant than a most significant bit of the bank address.

4. The semiconductor storage device of claim 3, further comprising:
an incrementing circuit that, in a case in which the bank address is the largest value, judges whether or not the column address is a largest value, and, in a case in which it is judged whether or not the column address is the largest value and the bank address is not a largest value, selects a row address except for the bank address as a row address to be input to a decoder, and, in a case in which the column address is the largest value, selects an address, which is obtained by incrementing by one the row address except for the bank address, as a row address to be input to the decoder.

5. The semiconductor storage device of claim 1, further comprising:
a switching section that switches whether or not the burst mode is to be executed, on the basis of a burst mode signal that is an input signal expressing whether or not the burst mode is to be executed.

6. A semiconductor storage device that has a plurality of banks, which include a plurality of word lines, and a plurality of sense amplifier blocks, which are shared between the plurality of banks respectively, and that, at a time of a burst mode, causes a plurality of sense amplifier blocks respectively, which are operated simultaneously with respect to the plurality of banks, to access any of the plurality of banks, the device comprising:
a selecting section that, at the time of the burst mode, selects, from the plurality of sense amplifier blocks, a first sense amplifier block and a second sense amplifier block that are to be operated simultaneously, on the basis of, from addresses that are assigned to a region of an input internal address, a block address that is an address for selecting any of the sense amplifier blocks from the plurality of sense amplifier blocks, and a bank address that is an address for selecting any of the plurality of banks, and a redundant Y-block control signal that is for selecting a redundant memory array included in the plurality of banks respectively;

a judging section that judges whether or not a value of the block address is a largest value;

a control section that carries out control so as to, in a case in which the value of the block address is the largest value, cause the first sense amplifier block to access one bank of the plurality of banks and the second sense amplifier block to access another bank of the plurality of banks, and, in a case in which the value of the block address is not the largest value, cause the first sense amplifier block and the second sense amplifier block to access the one bank; and a redundancy control section that, in a case in which the first sense amplifier block is made to access the one bank and the second sense amplifier block is made to access the other bank, causes the redundant memory array included in the one bank to access the first sense amplifier block and the redundant memory array included in the other bank to access the second sense amplifier block.

7. The semiconductor storage device of claim 6, further comprising:

a word line selecting section that selects a word line for a same bank or for each of respectively different banks that are accessed by the first sense amplifier block and the second sense amplifier block, on the basis of, from addresses assigned to a region of the internal address, a row address that includes the bank address and is an address for selecting any word line from the plurality of word lines, wherein a least significant bit of a bank address, which is, from addresses assigned to a region of the internal address, an address for selecting any of the plurality of banks, is assigned to a region of the internal address so as to become a bit that is one more significant than a most significant bit of the block address, and a least significant bit of the row address is the least significant bit of the bank address.

8. The semiconductor storage device of claim 7, further comprising:

a bit line selecting section that, in a case in which a value of the block address is a largest value, judges whether or not the bank address is a largest value, and, in a case in which the bank address is not the largest value, selects a bit line indicated by a column address that is, from addresses assigned to a region of the internal address, an address for selecting a column, and, in a case in which the bank address is the largest value, for one of a column selector having a smallest address and a redundant column selector belonging to a less significant bank, selects a bit line that is different than the bit line indicated by the column address, and, for another of the column selectors, selects the bit line indicated by the column address, wherein a least significant bit of the column address is assigned to a region of the internal address so as to become a bit that is one more significant than a most significant bit of the bank address.

9. The semiconductor storage device of claim 8, further comprising:

an incrementing circuit that, in a case in which the bank address is the largest value, judges whether or not the column address is a largest value, and, in a case in which it is judged whether or not the column address is the largest value and the bank address is not a largest value, selects a row address except for the bank address as a row address to be input to a decoder, and, in a case in which the column address is the largest value, selects an address, which is obtained by incrementing by one the row address except for the bank address, as a row address to be input to the decoder.

10. The semiconductor storage device of claim 6, further comprising:

a switching section that switches whether or not the burst mode is to be executed, on the basis of a burst mode signal that is an input signal expressing whether or not the burst mode is to be executed.

\* \* \* \* \*